(12) United States Patent
Montijo

(10) Patent No.: US 10,386,389 B2
(45) Date of Patent: Aug. 20, 2019

(54) MEASUREMENT SYSTEM THAT STORES SAMPLES ACQUIRED DURING A TIME WINDOW THAT INCLUDES A TRIGGER EVENT AND DURING A SUBSEQUENT USER-SPECIFIED TIME WINDOW

(71) Applicant: Keysight Technologies, Inc., Santa Rosa, CA (US)

(72) Inventor: Allen Montijo, Colorado Springs, CO (US)

(73) Assignee: Keysight Technologies, Inc., Santa Rosa, CA (US)

(*) Notice: Subject to any disclaimer, the term of this patent is extended or adjusted under 35 U.S.C. 154(b) by 305 days.

(21) Appl. No.: 15/056,511

(22) Filed: Feb. 29, 2016

(65) Prior Publication Data

US 2017/0248633 A1 Aug. 31, 2017

(51) Int. Cl.
*G01R 13/02* (2006.01)

(52) U.S. Cl.
CPC ....... *G01R 13/029* (2013.01); *G01R 13/0272* (2013.01)

(58) Field of Classification Search
None
See application file for complete search history.

(56) References Cited

U.S. PATENT DOCUMENTS

| | | | |
|---|---|---|---|
| 5,999,163 A | 12/1999 | Ivers et al. | |
| 6,753,677 B1 * | 6/2004 | Weller | G01R 13/0254 324/121 R |
| 7,558,936 B2 * | 7/2009 | Beale | G01R 13/029 711/154 |
| 8,042,007 B1 | 10/2011 | Chan et al. | |
| 8,843,336 B2 * | 9/2014 | Cain | G01R 13/0254 702/73 |
| 8,866,659 B2 | 10/2014 | Stein et al. | |
| 9,130,583 B2 | 9/2015 | Huang et al. | |
| 2007/0226406 A1 * | 9/2007 | Beale | G01R 13/029 711/110 |

(Continued)

FOREIGN PATENT DOCUMENTS

JP 05423961 B2 4/2011

OTHER PUBLICATIONS

Page 290 of Park, John, et al. Practical Data Acquisition for Instrumentation and Control Systems. Newnes, 2007.*

(Continued)

*Primary Examiner* — J. E. Schoenholtz

(57) ABSTRACT

A measurement system is provided that performs a trigger data acquisition algorithm. When the measurement system performs the trigger event data acquisition algorithm, it causes a preselected number of digital data samples acquired during a first time window that includes a trigger event and during a second time window that is specified by the user and that is subsequent in time to the first time window to be stored in memory. Digital data samples acquired after the end of the first time window and before the beginning of the second time window are not stored in memory. By not storing digital data samples acquired after the end of the first time window and before the beginning of the second time window, the possibility of overwriting samples that surround the trigger event is prevented and the memory is used very efficiently.

18 Claims, 5 Drawing Sheets

(56) References Cited

U.S. PATENT DOCUMENTS

| | | | | |
|---|---|---|---|---|
| 2008/0262779 A1* | 10/2008 | Bordow | ............. | G01R 31/3177 |
| | | | | 702/127 |
| 2009/0082982 A1* | 3/2009 | Cain | ................. | G01R 13/0254 |
| | | | | 702/77 |
| 2011/0137594 A1* | 6/2011 | Sullivan | ............. | G01R 13/0236 |
| | | | | 702/68 |

OTHER PUBLICATIONS

Cobham, "Interfacing the RAD1419 A/D Converter with the GRILB IP Core Library", Document No. GRLIB-AN-006, Oct. 30, 2015.*
Smith, S., The Scientist and Engineer's Guide to Digital Signal Processing at chapter 28 at Figure 28-3, downloaded from URL< http://www.dspguide.com/ch28/2.htm> on Aug. 6, 2018.*
Rao, D., "Circular Buffering on TMS320C6000", Application Report SPRA645A, Texas Instruments, Apr. 2001.*
Texas Instruments Application Report SNOA722B, Jul. 1981.*
Page 370 of Naidu, Prabhakar S. Modern Digital Signal Processing: an Introduction. Alpha Science Internat., 2006.*
Apple II, 1977 downloaded from URL< http://oldcomputers.net/appleii.html> on Aug. 6, 2018.*
Machine translation of JP05423961B2, published Apr. 7, 2011.

\* cited by examiner

MEASUREMENT SYSTEM THAT STORES SAMPLES ACQUIRED DURING A TIME WINDOW THAT INCLUDES A TRIGGER EVENT AND DURING A SUBSEQUENT USER-SPECIFIED TIME WINDOW

BACKGROUND

In measurement systems such as digital oscilloscopes, consecutively sampled values of an applied waveform are digitized, stored in a memory, and then used to reconstruct the waveform as a displayable image (the "trace") on a display device by reading and processing the stored values. The stored digital values are typically referred to as an acquisition record, the contents of which correspond to a definite time interval in the history of the applied waveform. The length of the time interval is largely determined by the number of addressable memory locations dedicated to signal acquisition and the rate at which the samples are acquired.

Many activities that are performed with an oscilloscope require that the displayed portion of the acquisition record be in some defined relationship to a detected event in the waveform, such as a rising or falling edge of the waveform, for example. The detected event is commonly referred to as a trigger, or trigger event. When the trigger event being detected is a condition of the waveform itself, the event is referred to as an internal trigger event. When the trigger event being detected is a condition outside of the waveform that has some relationship to the waveform being measured, such as another waveform, the event is referred to as an external trigger event. In response to a detected trigger event, some subset of the acquisition record is typically displayed to allow panning and zooming of the trace.

A technology known as "Jitter Free" technology has been patented by the assignee of the present application in U.S. Pat. No. 6,753,677, which is incorporated by reference herein in its entirety. Jitter Free technology may be used to correct for trigger jitter in an oscilloscope or other data acquisition system caused by horizontal noise and the imperfect response of the trigger event's analog signal paths. The Jitter Free method relies on standard triggering hardware to locate a trigger event in a waveform to within some small error, e.g., one nanosecond (ns) or less. Once the trigger event has been located, the Jitter Free method then processes the data acquired around the trigger event, optionally correcting the signal for various impairments in the signal path of the channel, and then locates the time of the trigger threshold crossing in the data. The time of the trigger threshold crossing may then be used for other purposes, such as, for example, plotting, making measurements and further signal processing.

With typical trigger modes, the user specifies a time window relative to the trigger event over which the waveform is to be sampled and stored in memory. This time window may or may not include the trigger event. In many applications, the time window does not include the trigger event. If the time window does not include the trigger event, the Jitter Free method cannot be used because no data surrounding the event remains, i.e., it has been overwritten. Therefore, the user's data may be compromised by the raw hardware limitations.

A typical triggered acquisition process for a real-time oscilloscope stores data in a circular buffer. When the trigger event occurs, the memory controller stores data samples until a number of post-trigger samples corresponding to the user-specified time window has been stored in the circular buffer. The memory controller then stops storing data samples. Because a circular buffer is used, if the number of post trigger samples is larger than the number of storage spaces in the circular buffer, then the information surrounding the trigger event, which are the oldest samples in the buffer, will be overwritten and therefore will not be available for correction by the Jitter Free method.

A need exists for a measurement system that captures and stores data surrounding a trigger event so that the data is available for subsequent processing, e.g., for correction via the Jitter Free method. A need also exists for a measurement system that captures and stores data surrounding a trigger event while ensuring that the data is not subsequently overwritten before it can be used, that captures and stores data within the user-specified time window, and that is efficient in terms of memory utilization.

SUMMARY

The present embodiments are directed to a measurement system configured to perform a trigger data acquisition algorithm, and methods performed by the system. The measurement system includes an analog-to-digital converter (ADC), a memory, and a processor. The ADC samples a time-varying waveform to create an acquisition record made up of acquired digital data samples. When the processor performs the trigger event data acquisition algorithm, the processor causes a preselected number of digital data samples acquired during a first time window that includes a trigger event and during a second time window that is specified by the user and that is subsequent in time to the first time window to be stored in memory. Digital data samples acquired after the end of the first time window and before the beginning of the second time window are not stored in memory. By not storing digital data samples acquired after the end of the first time window and before the beginning of the second time window, the possibility of overwriting samples that surround the trigger event is prevented and the memory is used very efficiently.

These and other features and advantages will become apparent from the following description, claims and drawings.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
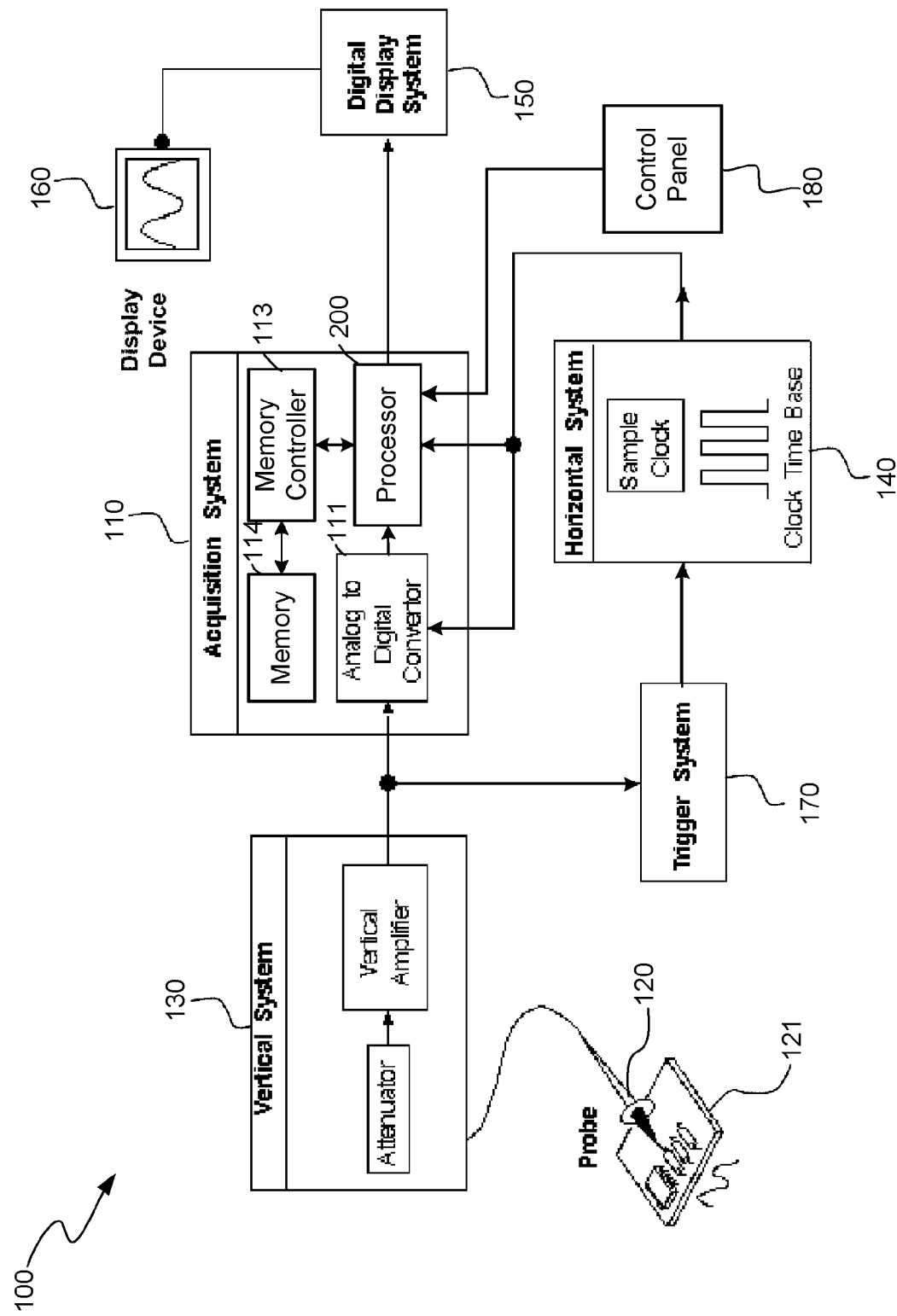
FIG. 1 illustrates a block diagram of portions of a measurement system in accordance with an illustrative embodiment having a data acquisition system configured to perform a trigger data acquisition algorithm that stores a preselected, programmable amount of data during a first time window that includes a trigger event, that discontinues storing data until the beginning a second time window that is specified by the user, and that resumes storing data during the user-specified second time window.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a," "an," and "the" include both singular and plural referents, unless the context clearly dictates otherwise. Thus, for example, "a device" includes one device and plural devices. Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

FIG. 1 illustrates a block diagram of portions of a measurement system 100 in accordance with an illustrative embodiment having a data acquisition system 110 configured to perform a trigger data acquisition algorithm that stores a preselected, programmable amount of data during a first time window that includes a trigger event (i.e., before, after and during the trigger event), that discontinues storing data until the beginning a second time window that is specified by the user, and that resumes storing data during the user-specified second time window. By discontinuing data storage for a period of time between the end of the first time window and the beginning of the second, user-specified time window, memory is conserved and the possibility of overwriting data surrounding the trigger event is eliminated.

The measurement system 100 also includes a probe 120, a vertical system 130, a horizontal system 140, a display system 150, and a display device 160, a trigger system 170, and a control panel 180. The probe 120 is an input device that routes a signal from a device under test (DUT) 121 to the measurement system 100. The vertical system 130 controls the voltage scale on the display device 160. The horizontal system 140 controls the time scale on the display device 160. The display system 150 controls the display of information on the display device 160. The trigger system 170 detects trigger events and informs the data acquisition system 110 when a trigger event is detected. The trigger system 170 also stabilizes and focuses the measurement system 100 so that the waveform being displayed on the display device 160 appears static and unflinching. The control panel 180 is an input device that allows a user to control the measurement system 100 by making selections that are treated by a processor 200 as commands that cause the processor 200 to perform various tasks.

The processor 200 may be any suitable computational device, including, for example, a microprocessor, a microcontroller, a digital signal processor (DSP), an application specific integrated circuit (ASIC), or other similar device that is capable of being programmed or configured to carry out the tasks associated with performing the trigger data acquisition algorithm. The term "processor," as that term is used herein, means at least one processor, and therefore could include multiple processors or processing cores. The processor may, for example, be a multi-core processor. A processor may also refer to a collection of processors within a single computer system or distributed amongst multiple computer systems.

The data acquisition system 110 also includes an analog-to-digital converter (ADC) 111, a memory controller 113 and a memory device 114. The processor 200, by controlling the memory controller 113, causes the trigger data acquisition algorithm to be performed. The memory controller 113 writes and reads the memory device 114. The processor 200 causes a write memory control portion (not shown) of the memory controller 113 to write digital data samples output from the ADC 111 to the memory device 114 during the first time window that surrounds the trigger event, to stop storing digital data samples output from the ADC 111 until the beginning of the user-specified second time-window, and then to resume storing digital data samples output from the ADC 111 during the user-specified second time window.

Figure 2:
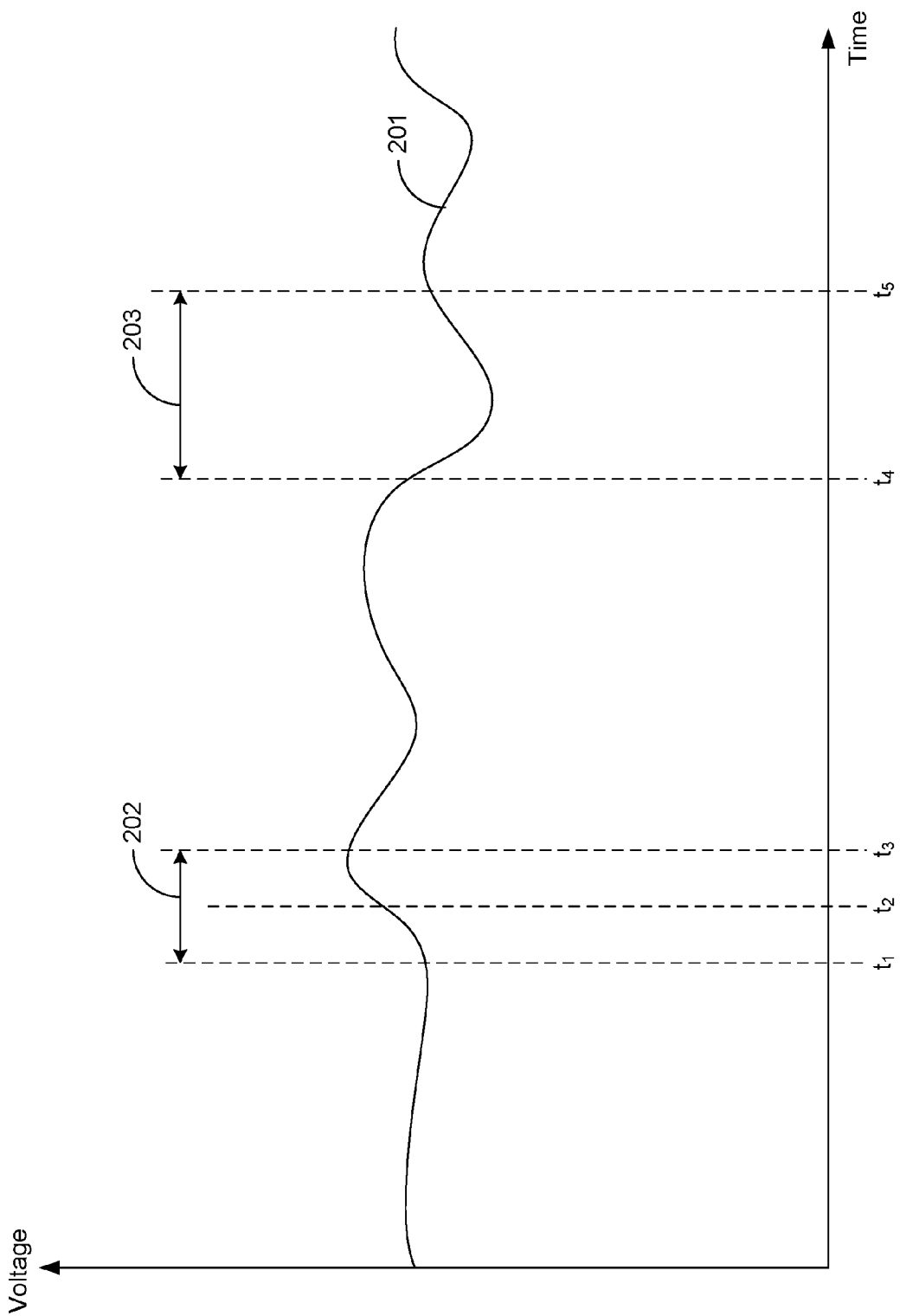
FIG. 2 illustrates a plot of a time-varying waveform and demonstrates first and second time windows during which digital data samples output from the ADC of the data acquisition system shown in FIG. 1 are written to storage locations in the memory device of the data acquisition system.

FIG. 2 illustrates a plot of a time-varying waveform 201 and demonstrates first and second windows of time 202 and 203, respectively, during which digital data samples output from the ADC 111 are written by the memory controller 113 to storage locations in the memory device 114. For illustrative, or exemplary, purposes, it is assumed that a trigger event occurs at a second instant in time, $t_2$, that follows a first instant in time, $t_1$, and that precedes a third instant in time, $t_3$. The first window of time 202 starts at the first instant in time $t_1$ and ends at the third instant in time $t_3$. It will also be assumed that the second window of time 203 is user specified in that the user has indicated in some way, e.g., through making a selection via the control panel 180, that the second window of time is to start at some instant in time $t_4$ relative to when the trigger event occurs and is to end at some instant in time $t_5$ relative to when the trigger event occurs. The length of the first window of time 202 is preselected and may also be specified in some way by the user, e.g., through making a selection via the control panel 180.

The memory controller 113 is configured to store digital data samples in the memory device 114 that are output from the ADC 111 during the first and second windows of time 202 and 203, respectively, and to not store digital data samples in memory device 114 that are output from the ADC 111 during the window of time that is in between the first and second windows of time 202 and 203, respectively. Saving the digital data samples that are output from the ADC 111 during the first window of time 202 ensures that the aforementioned Jitter Free method may be used in conjunction with the embodiments described herein to process and correct the data samples that surround and include the trigger event. Not saving the digital data samples in memory device 114 that are output from the ADC 111 during the window of time that is in between the first and second windows of time 202 and 203, respectively, consumes less memory and therefore makes efficient use of memory device 114. A variety of hardware, software and/or firmware configurations can be used to accomplish these objectives, a few of which are described for illustrative purposes.

Figure 3:
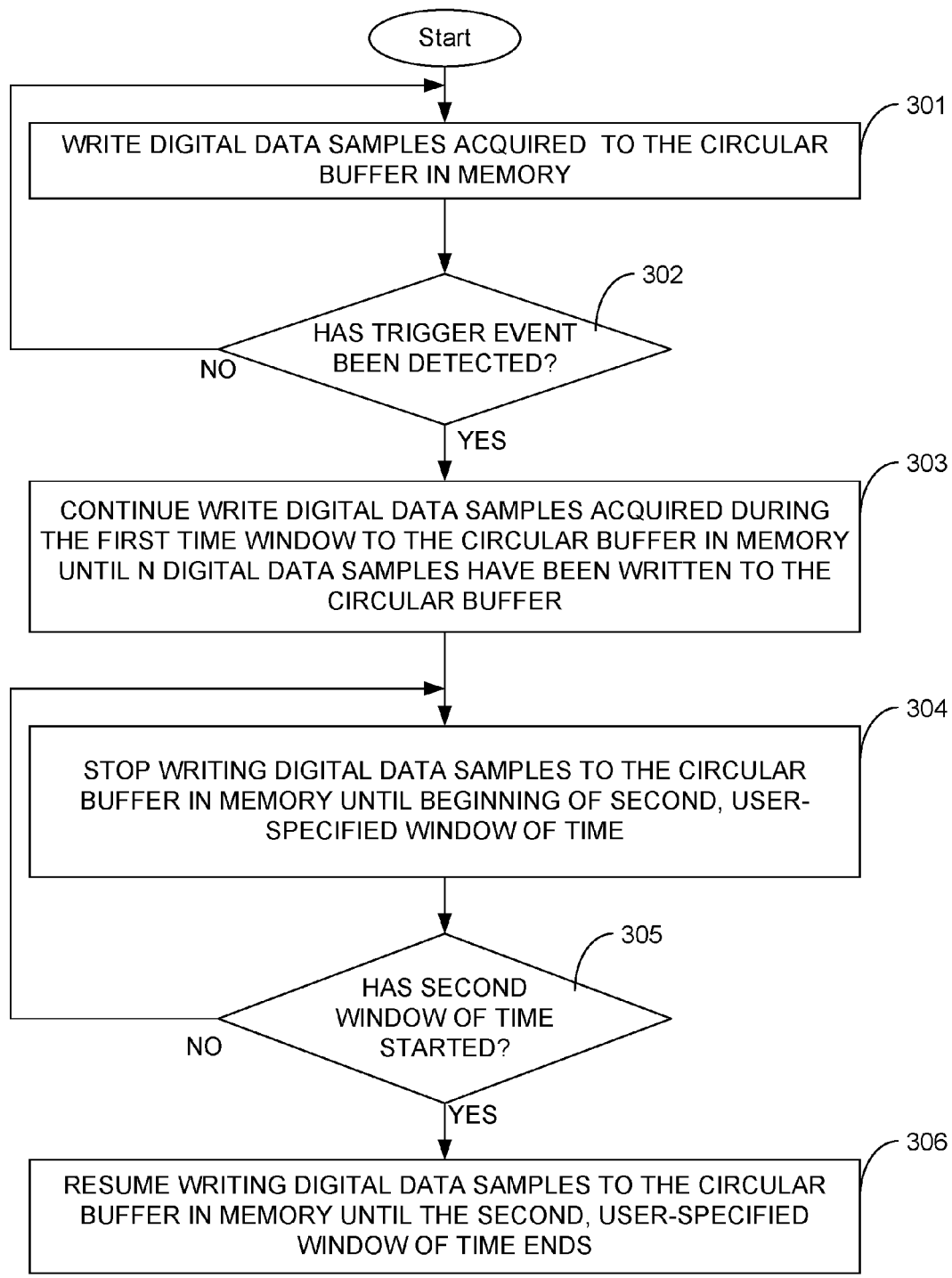
FIG. 3 illustrates a flow diagram that represents the trigger data acquisition method in accordance with an illustrative embodiment performed by the measurement system shown in FIG. 1.

FIG. 3 illustrates a flow diagram that represents the trigger data acquisition method in accordance with an illustrative embodiment performed by the measurement system 100 shown in FIG. 1. The method will be described with reference to FIGS. 1-3 and it will be assumed for illustrative purposes that the time-varying waveform 201 shown in FIG. 2 is being measured, that the trigger event occurs at time $t_2$ and that the second window of time 203 has been specified by the user. The method starts when the measurement system 100 is placed in the trigger acquisition mode. At some instant in time prior to the occurrence of the trigger event, digital data samples that are output from the ADC 111 begin being written by the memory controller 113 to a circular buffer in memory device 114, as indicated by block 301. Depending on the length of time that passes before the trigger event occurs, the circular buffer may be overwritten multiple times.

The processor 200 monitors the output of the trigger system 170 to detect when the trigger event occurs, as indicated by block 302. As long as the trigger event is not detected, the memory controller 113 continues writing digital data samples to the circular buffer of the memory device 114. At the second instant in time $t_2$, the trigger event is detected and the process proceeds to block 303. The trigger event can be any type of trigger event, automatically triggered or triggered by the user, and can be an internal or external trigger event. When the trigger event is detected at the second instant in time $t_2$, the memory controller 113 writes a preselected number, N, of digital data samples to the circular buffer in memory device 114, as indicated by block 303. N is a preselected value and a positive integer that is greater than or equal to one.

After N digital data samples have been written to the memory device 114, the memory controller 113 stops writing the digital data samples output from the ADC 111 to the circular buffer in memory device 114, as indicated by block 304. After the memory controller 113 has stopped writing digital data samples to the memory device 114, the processor 200 determines when the second window of time starts, as indicated by block 305. At the fourth instant in time $t_4$, the user-specified, second window of time starts and the memory controller 113 resumes writing digital data samples to the circular buffer in memory device 114 and continues writing until the end of the second time window at the fifth instant in time $t_5$, as indicated by block 306. M digital data samples are written to the memory device 114 during the second window of time. M is a preselected value and a positive integer that is greater than or equal to one.

In accordance with an embodiment, the circular buffer is precisely large enough to hold the digital data samples that are acquired and written to the circular buffer during the first and second windows of time 202 and 203, respectively. Thus, in accordance with this representative embodiment, the digital data samples written to the circular buffer during the first and second windows of time 202 and 203, respectively, completely fill the circular buffer. By the fifth instant in time $t_5$, the oldest digital data sample contained in the circular buffer is the sample acquired at the first instant in time $t_1$, which is the oldest sample needed in order to perform the Jitter Free method.

Figure 4:
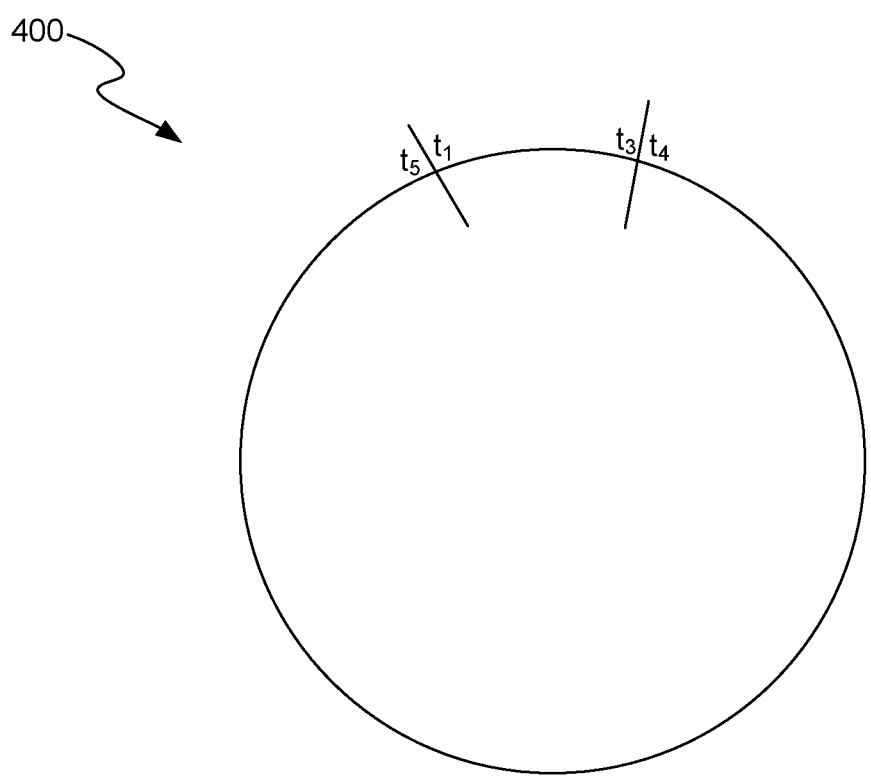
FIG. 4 illustrates a pictorial diagram of a circular buffer of the memory device shown in FIG. 1 in accordance with an embodiment in which the circular buffer is only large enough to contain the digital data samples that are acquired and written to the circular buffer during the first and second windows of time.

FIG. 4 illustrates a pictorial diagram of the circular buffer 400 in accordance with an embodiment in which the circular buffer 400 is only large enough to contain the digital data samples that are acquired and written to the circular buffer during the first and second windows of time 202 and 203, respectively. The circular buffer 400 contains only samples stored during the first and second windows of time 202 and 203, respectively, from time $t_1$ to $t_3$ and then from time instant $t_4$ to $t_5$, respectively.

The circular buffer 400 comprises a range of storage locations in the memory device 114. The range of storage locations is selected based on the size of the user-specified second window of time 203. Therefore, the size of, i.e., the total number of storage locations in) the circular buffer 400 is allocated dynamically based, at least in part, on the size of the user-specified, second window of time 203. Because the size of the first window of time 202 is always known and is preselected based on the number of samples needed to perform the Jitter Free method, and because the user-specified, second window of time 203 is also known when it is allocated, the memory controller 13 knows precisely how many samples can be discarded in between the third instant in time $t_3$ when the first window of time 202 ends and the fourth instant in time $t_4$ when the second window of time 203 begins. In rare cases it is possible that the user-specified, second window of time 203 is so large that the maximum range of the circular buffer 400 is not large enough to accommodate the samples for the first and second windows of time 202 and 203, respectively. In that case, the sample rate used during the second window of time 203 may be reduced based on the maximum number of storage locations that the circular buffer 400 has such that the number of samples stored for the first window of time 202 plus the number of samples stored for the second window of time 203 add up to the maximum number of storage locations in the circular buffer 400.

Figure 5:
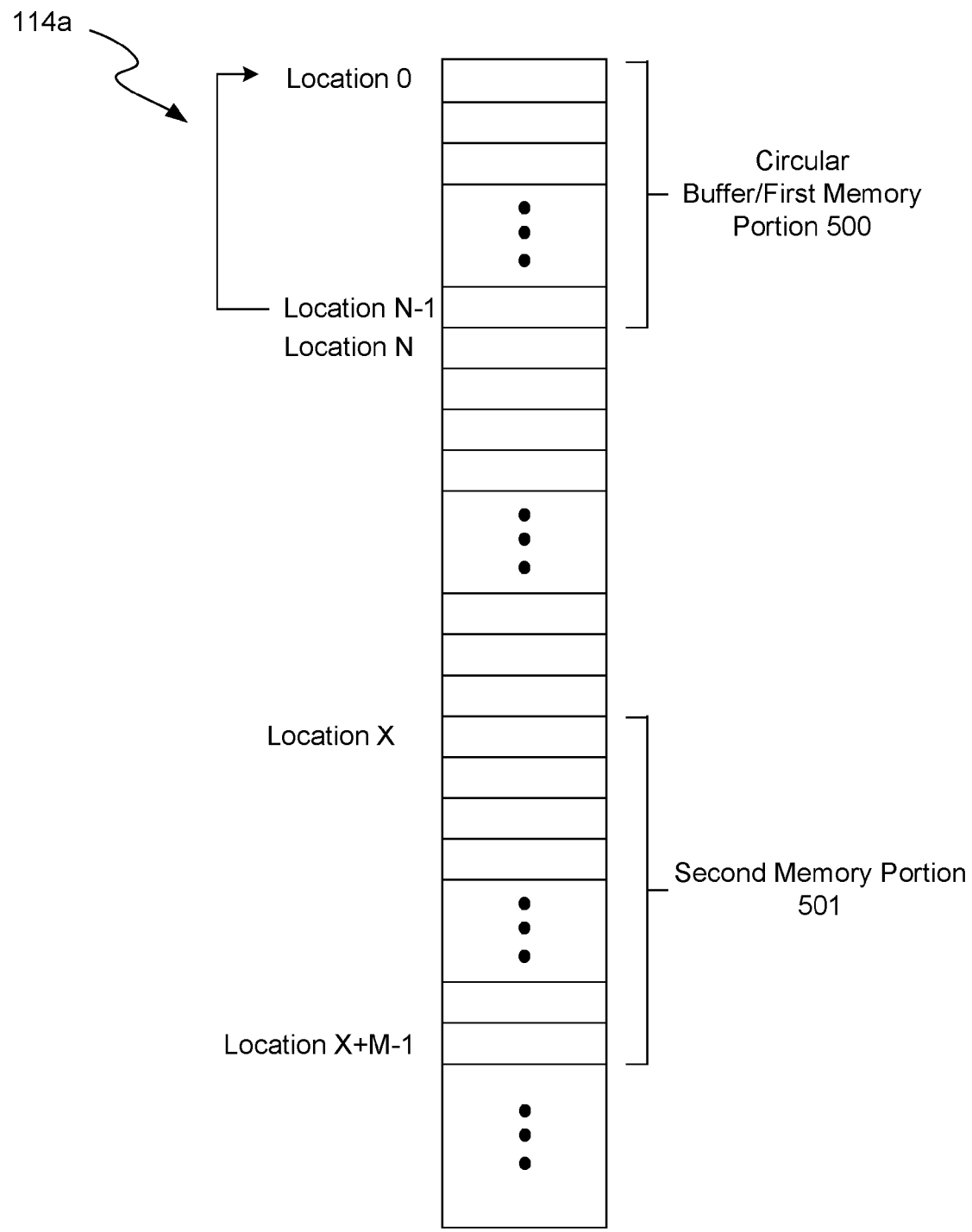
FIG. 5 illustrates a block diagram of a portion of memory device shown in FIG. 1 in accordance with another illustrative embodiment in which the circular buffer of the memory device is a fixed range of storage locations in the memory device that is used for storing the samples that surround the trigger.

FIG. 5 illustrates a block diagram of a portion 114a of memory device 114 in accordance with another illustrative embodiment in which the circular buffer 500 is a fixed range of storage locations in the memory device 114 that is used for storing the samples that surround the trigger, e.g., the samples acquired during the first window of time 202. However, the circular buffer 500 is not used for storing the samples acquired during the user-specified, second window of time 203. Rather, a second memory portion 501 comprising storage locations in memory device 114 ranging from storage location X to storage location X+M−1 is used for linearly storing samples acquired during the second window of time 203, where X is some address in the memory device 114 and M is the total number of samples stored during the second window of time 203. The circular buffer 500 is used by the memory controller 113 in the same manner as described above with reference to FIGS. 3 and 4, but the memory controller 113 uses the second memory portion 501 of the memory device 114 for storing the samples acquired during the second window of time 203.

Some measurement systems have the capability to capture a waveform at multiple different rates. In some cases, it is beneficial to sample and store the waveform during the first window of time 202 at the maximum rate, even if the waveform in the user-specified, second window of time 203 is being sampled and stored at some lower sample rate. With respect to the configuration of the portion 114*a* of the memory device 114 shown in FIG. 5, the circular buffer 500 could hold samples that were captured at the full rate and the second memory portion 501 could hold samples that were captured at a lower, appropriate sample rate.

As indicated above, the trigger data acquisition algorithm described above with reference to FIGS. 1-5 is performed or caused to be performed by the processor 200. In order to carry out the tasks associated with the qualified store algorithm, the processor 200 is configured to execute computer instructions, or code, in the form of software and/or firmware. These instructions are stored in one or more memory devices that are internal (e.g., memory device 114) to or external (not shown) to the measurement system 100. Such memory devices constitute non-transient computer-readable mediums. A variety of non-transient computer-readable mediums are suitable for this purpose, including, for example, solid state storage devices, magnetic storage devices and optical storage devices.

It should be noted that the invention has been described with reference to illustrative, or representative, embodiments and that the invention is not limited to the disclosed embodiments. Many variations may be made to the disclosed embodiments without deviating from the scope of the invention, as will be understood by those of skill in the art in view of the description provided herein, the drawings, and the appended claims.

What is claimed is:

1. A measurement system comprising:
   an analog-to-digital converter (ADC) configured to sample a time-varying waveform to create an acquisition record made up of acquired digital data samples;
   memory; and
   a processor configured to perform a trigger data acquisition algorithm, wherein when the processor performs the algorithm, the processor causes a preselected number of digital data samples acquired during a first window of time that includes a trigger event to be stored in the memory and causes digital data samples acquired during a second window of time that is specified by user to be stored in the memory, the second window of time being subsequent in time to the first window of time, and wherein the processor prevents digital data samples acquired during a time period that is after an end of the first window of time and before a beginning of the second window of time from being stored in the memory.

2. The measurement system of claim 1, wherein the memory has a first memory portion that operates as a circular buffer, the circular buffer comprising a range of storage locations, each storage location capable of storing a respective digital data sample, the digital data samples acquired during the first and second windows of time being stored at respective storage locations in the circular buffer.

3. The measurement system of claim 2, wherein the range of storage locations comprising the circular buffer is preselected based at least in part on a length of the second window of time specified by the user.

4. The measurement system of claim 2, wherein after the trigger event, no digital data samples other than the digital data samples acquired during the first and second windows of time remain stored in the circular buffer.

5. The measurement system of claim 2, wherein the digital data samples acquired during the first window of time are acquired at a first sample rate and wherein the digital data samples acquired during the second window of time are acquired at a second sample rate that is different from the first sample rate.

6. The measurement system of claim 2, wherein the digital data samples acquired during the first and second windows of time are acquired at a full sample rate of the measurement system.

7. The measurement system of claim 1, wherein the memory has a first memory portion that operates as a circular buffer and a second memory portion that acts as linear memory, wherein the digital data samples acquired during the first and second windows of time are stored in the circular buffer and in the linear memory, respectively.

8. The measurement system of claim 7, wherein the first and second memory portions each have a range of storage locations, and wherein a number of storage locations in the second memory portion is preselected based at least in part on a length of the second window of time specified by the user.

9. The measurement system of claim 7, wherein the digital data samples acquired during the first window of time are acquired at a first sample rate and wherein the digital data samples acquired during the second window of time are acquired at a second sample rate that is different from the first sample rate.

10. The measurement system of claim 7, wherein the digital data samples acquired during the first and second windows of time are acquired at a full sample rate of the measurement system.

11. The measurement system of claim 1, wherein the processor is also configured to perform an algorithm that reduces jitter in the digital data samples acquired during the first window of time.

12. A non-transitory computer-readable medium having a computer program stored thereon for performing a trigger data acquisition algorithm, the program comprising:
   a first code segment for causing a memory controller to write digital data samples to a memory;
   a second code segment that processes the digital data samples to determine whether a trigger event has occurred;
   a third code segment, wherein if the second code segment determines that a trigger event has occurred, the third code segment causes the memory controller to continue writing digital data samples to the memory until a preselected number of digital data samples acquired during a first time window that includes the trigger event have been written to the memory;
   a fourth code segment, wherein after the third code segment has caused the memory controller to write the preselected number of digital data samples acquired during a first window of time to the memory, the fourth code segment prevents the memory controller from writing digital data samples acquired after an end of the first window of time and before a beginning of a second time window to the memory, wherein the second window of time is subsequent in time to the first window of time and is specified by a user; and
   a fifth code segment, the fifth code segment causing the memory controller to resume writing acquired digital data samples to the memory during the second window of time, the fifth code segment causing a preselected number of digital data signals to be written to the memory during the second window of time.

13. The non-transitory computer-readable medium of claim 12, wherein the memory has a first memory portion that operates as a circular buffer, the circular buffer comprising a range of storage locations, each storage location capable of storing a respective digital data sample, the digital data samples acquired during the first and second windows of time being stored at respective storage locations in the circular buffer.

14. The non-transitory computer-readable medium of claim 13, wherein the range of storage locations comprising the circular buffer is preselected based at least in part on a length of the second window of time specified by the user.

15. The non-transitory computer-readable medium of claim 14, wherein after the trigger event, no digital data samples other than the digital data samples acquired during the first and second windows of time remain stored in the circular buffer.

16. The non-transitory computer-readable medium of claim 13, wherein the memory has a first memory portion that operates as a circular buffer and a second memory portion that acts as linear memory, wherein the digital data samples acquired during the first and second windows of time are stored in the circular buffer and in the linear memory, respectively.

17. The non-transitory computer-readable medium of claim 16, wherein the first and second memory portions each have a range of storage locations, and wherein a number of storage locations in the second memory portion is preselected based at least in part on a length of the second window of time specified by the user.

18. The non-transitory computer-readable medium of claim 12, further comprising:
   one or more code segments that process the digital data samples acquired during the first window of time to reduce jitter in the digital data samples acquired during the first window of time.

* * * * *